United States Patent [19]

Mariyama

[11] Patent Number: 5,747,836

[45] Date of Patent: May 5, 1998

[54] SEMICONDUCTOR INTEGRATED CIRCUIT PROVIDED WITH THYRISTOR

[75] Inventor: Mitsuru Mariyama, Kitakatsuragi-gun, Japan

[73] Assignee: Sharp Kabushiki Kaisha, Osaka, Japan

[21] Appl. No.: 712,563

[22] Filed: Sep. 11, 1996

[30] Foreign Application Priority Data

Sep. 11, 1995 [JP] Japan .................................. 7-233037
Jul. 12, 1996 [JP] Japan .................................. 8-183701

[51] Int. Cl.[6] .......................... H01L 29/74; H01L 31/111
[52] U.S. Cl. .......................... 257/119; 257/121; 257/123; 257/124; 257/133; 257/146; 257/175; 327/326; 327/344; 327/381; 327/421; 327/428; 327/584
[58] Field of Search ........................... 257/119, 121, 257/123, 124, 133, 146, 175; 327/194, 288, 326, 344, 381, 421, 428, 446, 455, 457, 584

[56] References Cited

U.S. PATENT DOCUMENTS

| | | |
|---|---|---|
| 4,047,054 | 9/1977 | Ahmed .................................. 307/252 |
| 4,535,251 | 8/1985 | Herman et al. ........................ 250/551 |
| 4,768,075 | 8/1988 | Broich et al. . | 
| 4,959,556 | 9/1990 | Dekker et al. ........................ 307/261 |
| 5,424,563 | 6/1995 | Temple et al. ........................ 257/154 |

FOREIGN PATENT DOCUMENTS

| | | |
|---|---|---|
| 60-074678A | 4/1985 | Japan . |
| 62-122272A | 6/1987 | Japan . |
| 1-17268 | 3/1989 | Japan . |

*Primary Examiner*—Ngân V. Ngô

[57] ABSTRACT

A dV/dt clamp circuit is connected to a base of a phototransistor for triggering a control electrode of a thyristor, thereby making an attempt to prevent an operation error. A control electrode voltage of the thyristor is applied to the gate of the MOSFET via a high breakdown voltage capacitor. The gate electrode voltage of the MOSFET can be continuously held at a threshold value or more by adjusting a zener voltage of a zener diode and a resistance value of a resistor. Since with a high dV/dt the MOSFET can be operated at a high speed to allow conduction between the drain and source of the MOSFET, the phototransistor does not trigger the thyristor, thereby preventing an operation error.

11 Claims, 15 Drawing Sheets

SEMICONDUCTOR INTEGRATED CIRCUIT PROVIDED WITH THYRISTOR

BACKGROUND OF THE INVENTION

1. Field of the Invention

The present invention relates to a semiconductor integrated circuit provided with a thyristor or a bidirectional three terminal thyristor which is known under a commercial name "triac", integrated with a gate drive circuit on a semiconductor chip. More particularly, the invention relates to an improvement directed to a high breakdown dV/dt and a high breakdown pulse noise in a semiconductor integrated circuit wherein a phototransistor or the like is incorporated so as to be optically controlled.

2. Description of the Related Art

Conventionally, as shown in FIGS. 12, 13 and 14, an optically controlled bidirectional three terminal thyristor is widely used in so-called solid state relays (SSR's) or the like, the thyristor having thyristors for two channels which are formed on the same semiconductor chip in directions opposite to each other and a gate drive circuit for each channel. FIG. 12 is a schematic plane view showing the prior art. FIG. 13 is a sectional view thereof taken along line XIII—XIII of FIG. 12. FIG. 14 is a diagram showing an equivalent electric circuit. In FIG. 14, an equivalent circuit in a gate drive circuit for a channel 1 on one side is shown.

An impurity concentration in an N-type silicon substrate 1 is generally set to $10^{13}$ to $10^{15}$ cm$^{-3}$. A P-type diffusion region is formed using boron as an impurity and the impurity concentration thereof is set to $10^{15}$ to $10^{19}$ cm$^{-3}$. The N-type diffusion region is formed using phosphorus or the like as an impurity. The concentration thereof is set to $10^{20}$ cm$^{-3}$ or more.

On a surface side of the N-type silicon substrate 1, a P-type anode diffusion region 2 and a P-type gate diffusion region 3 located opposite to the anode diffusion region 2 are provided. Inside of the gate diffusion region 3, an N-type cathode diffusion region 4 is formed. As a consequence, a PNPN type reverse blocking thyristor is formed from the anode diffusion region 2 toward the cathode diffusion region 4. Such thyristors are formed in directions opposite to each other as channel (ch) 1 and channel (ch) 2 and connected to each other to constitute a bidirectional three terminal thyristor.

A P-type impurity is diffused in a predetermined region between the gate diffusion region 3 and the cathode diffusion region 4 to form a gate resistor 5. When light is applied directly to the chip surface of such bidirectional three terminal thyristor, the thyristor can be operated as an optically controlled bidirectional thyristor which can be triggered with an optical signal.

To heighten the sensitivity as an optically controlled bidirectional thyristor, a phototransistor may be incorporated therein. When an alternating current supply is controlled, a zero-cross function may be provided for triggering the thyristor within a range under a limited voltage around a zero-cross of the alternating current voltage. When needed, a gate drive circuit may be formed on the same semiconductor chip.

A base diffusion region 6 and an emitter diffusion region 7 constitute a phototransistor 8 having the N-type silicon substrate 1 which serves as a collector. A MOSFET 9 for the zero-cross function is formed in the P-type diffusion region. In the periphery of the N-type silicon substrate 1 is formed a channel stopper 10 in which a high concentration of the N-type impurity is diffused.

First and second electrodes T1 and T2 which serve as the bidirectional three terminal thyristor are provided as terminal frames 11 and 12, respectively. Terminal frames 11 and 12 are connected to aluminum wirings 15 and 16 on the semiconductor chip 1 respectively with wires 13 and 14. The Al wirings 15 and 16 electrically connect the anode diffusion region 2 of one channel with the cathode diffusion region 4 of the other channel, and further on the extension of the aluminum wirings 15 and 16 are formed bonding pads 17 and 18, respectively. A base resistor 19 is formed between the base diffusion region 6 and emitter diffusion region 7 of the phototransistor 8.

As shown in FIG. 14, the thyristor 20 for one channel is constituted with a series connection of an equivalent PNP transistor 21 and an equivalent NPN transistor 22. The base of the equivalent PNP transistor 21 and the collector of the equivalent NPN transistor 22 are connected to an N-type silicon substrate 1. A collector of the output transistor 23 which is connected to the phototransistor 8 with a Darlington circuit is connected to the N-type silicon substrate 1. The base resistor 19 is connected between a base and an emitter of the output transistor 23. An input transistor 24 is connected between the base and the emitter of the phototransistor 8. A junction capacitance (Cj) 25 is present between the collector and the base of the phototransistor 8. A punch-through diode 26 is connected to the gate side of the MOSFET 9 to enable a zero-cross operation. The punch-through diode 26 is a three terminal semiconductor device having a cathode terminal 28, an anode terminal 27, and a gate terminal 29 to hold the MOSFET 9 in an OFF state only in the vicinity of the zero-cross voltage.

FIGS. 15 and 16 show the equivalent circuit of the punch-through diode 26 and a sectional structure of the semiconductor chip respectively. As shown in FIG. 15, a photodiode 30 and a junction capacitance 31 thereof are connected in parallel in the punch-through diode 26, and a zener diode 32 is connected in series with respect to these parallel circuits. The cathode of the photodiode 30 is connected to the anode terminal 28 of the punch-through diode 26 while the anode of the zener diode 32 is connected to the cathode terminal 27 of the punch-through diode 26. A connection point of the anode of the photodiode 30 and the cathode of the zener diode 32 is connected to the gate terminal 29.

The punch-through diode 26 charges a gate electrode of the MOSFET 9 with a photovoltaic power generated at each process of applying light to the photodiode 30 and a deviation current i via the junction capacitance 31, thereby controlling an operational behavior of the MOSFET 9. On the other hand, the punch-through diode 26 equivalently applies a voltage clamp with the zener diode 32 to prevent the breakage of the gate insulating film of the MOSFET 9 with the application of a high voltage. In other words, the gate voltage of the MOSFET 9 is prevented from rising to a predetermined voltage or more. An electric resistance value of the zener diode 32 is extremely high until the voltage of the gate electrode of the MOSFET 9 reaches a zener voltage of the zener diode 32. Thus, it is possible to regard that the zener diode 32 is held in an open state in terms of an electric circuit.

When the punch-through diode 26 is not used, the potentials of the N-type silicon substrate 1 and the MOSFET 9 assume to be equal, so that a maximum voltage of about 1000V is applied to the gate electrode of the MOSFET 9 and insulation breakdown easily occurs.

The photodiode 30 and the junction capacitance 31 are formed on a junction part located between the N-type silicon substrate 1 and the gate diffusion region 33 which serves as a punch-through diode 26 as shown in FIG. 16. The voltage of the gate terminal 29 is clamped to about 100V between the gate diffusion region 33 and the cathode diffusion region 34 which serves as the punch-through diode 26.

In the punch-through diode 26, the junction capacitance 31 can be enlarged only to about several pF and the deviation current i cannot be raised so much. Besides, since an operational response of the photovoltage power by the photodiode 30 is generally slow, a certain amount of time is required to charge the punch-through diode to allow the MOSFET 9 to conduct. Consequently, the punch-through diode 26 can sufficiently respond to the frequency of the alternating current supply, but the punch-through diode 26 is slow in operation response to a dV/dt noise which reaches a level of about 1000V/μs or a pulse noise of 1000V or more with a width of about 0.1 to 1 μs which is mixed into the alternating current line.

A prior art using the punch-through diode is also disclosed in Japanese Unexamined Patent Publications JP-A 60-74678 (1985) and JP-A 62-122272 (1987). JP-A 60-76478 discloses a structure in which a P-type floating region is provided in the vicinity of the P-type gate diffusion region on a semiconductor chip of a photo-bidirectional three terminal thyristor incorporating a MOSFET which is formed on an N-type substrate, and connected to the gate of the MOSFET. In this structure, a depletion layer which is formed on a PN junction between the P-type gate diffusion region and the N-type substrate is extended with a rise of a voltage between the anode and the cathode to attain a P-type floating region to punch-through the region, which makes it possible to suppress the voltage applied to the MOSFET gate so as not to become higher than needed.

Japanese Unexamined Patent Publication JP-A 62-122272 (1987) discloses a structure of an improvement of the structure disclosed in JP-A 60-74678, in which a shallow P⁺ region of a high concentration partially overlaps the P-type floating region. With such improvement, a punch-through generated between the respective regions is accurately controlled so that a voltage applied to the gate of the MOSFET can be easily and accurately fixed to a sufficiently low value.

FIG. 17 shows a state in which a zero-cross function which comprises a MOSFET 9 and a punch-through diode 26 is removed from an equivalent circuit shown in FIG. 14. Another prior art using the FET in place of the output transistor 23 is disclosed in Japanese Examined Patent Publication JP-B2 1-17268 (1989).

To prevent an operation error of the thyristor owing to a voltage showing a steep dV/dt, a zero-cross type photo-bidirectional three terminal thyristor to which a circuit capable of clamping an abruptly changing voltage is added is manufactured by Siemens AG, Germany.

FIG. 18 is a schematic plane view showing a photo-bidirectional three terminal thyristor manufactured by Siemens AG. FIG. 19 is an equivalent circuit diagram of a thyristor 102 of a photo-bidirectional three terminal thyristor which is described in technical documents of Siemens AG. FIG. 20 is an equivalent circuit diagram of a dV/dt clamp circuit 104 which is included in a thyristor 102a which corresponds to one channel of a photo-bidirectional three terminal thyristor.

In the photo-bidirectional three terminal thyristor 101, thyristors 102a and 102b are respectively formed as one chip. The two chips are arranged on one frame and connected to an electrode for external connection with a wire 123. Since the thyristors 102a and 102b are identically structured, the thyristor 102a will be explained. In the thyristor 102a, like reference numerals denotes like constituent parts in the circuit diagram shown in FIGS. 14 and 15, and an explanation thereof will be omitted.

The thyristor 102a is provded with a PNP transistor 105 having the base common with the equivalent PNP transistor 21, and the emitter and collector of the PNP transistor 105 are connected to the first electrode T1 and a base of the output transistor 23, respectively. In place of the phototransistor 8 shown in FIG. 14, an NPN transistor 106 and a photodiode 107 are provided. Since the anode of the photodiode 107 is connected to the base of the NPN transistor 106, current flows from the photodiode 107 when light is applied thereto, to allow the NPN transistor 107 to conduct. In the photo-bidirectional three terminal thyristor 101, the operation of the thyristor 102 is controlled by applying light thereto from a light-emitting diode 121 which is electrically insulated with the thyristor 102a.

The thyristor 102a is provided with a zero-cross drive circuit 103 and a dV/dt clamp circuit 104. The dV/dt clamp circuit 104 comprises an N-channel type MOSFET 108, a capacitor 109 and a P-channel MOSFET 110, and a zener diode 112. The drain of the MOSFET 108 is connected to the base of the transistor 106 while the source of the MOSFET 108 is connected to the second electrode T2 together with the source of the MOSFET 9. To the gate of the MOSFET 108 is connected one end of the capacitor 109, another end of which is connected to the N-type silicon substrate 1.

With respect to the MOSFET 110 and 111, the source of the MOSFET 110 and the source of the MOSFET 111 are connected, and the potential at the node is supplied to the gate of the MOSFET 9 for zero-cross operation. The drain of the MOSFET 110 is connected to the gate of the MOSFET 108, and both the gate and a substrate terminal of the MOSFET 110 are connected to the second electrode T2. The substrate terminal of the MOSFET 111 is connected to the N-type silicon substrate 1 and the gate and drain of the MOSFET 111 are connected to the second electrode T2. The MOSFETs 110 and 111 are shown equivalently as variable resistors 122. The anode of the zener diode 112 is connected to the second electrode T2 and the cathode thereof is connected to the gate of the MOSFET 108. Consequently, a parallel circuit formed of a zener diode 112 and variable resistors 122 is connected to the gate of the MOSFET 108.

When a momentarily changing voltage is applied to the dV/dt clamp circuit 104, current flows from the capacitor 109 to allow the MOSFETs 110 and 111 to conduct. The MOSFETs 110 and 111 equivalently serves as variable resistors 122. The resistance value is set to, for example, 120 kΩ until a voltage of a level at which a predetermined semiconductor region of the MOSFETs 110 and 111 are pinched off is applied. The application of current from the capacitor 109 allows the MOSFETs to conduct to operate the transistor 106.

Thereafter, the gate voltage of the zero-cross MOSFET rises, and the application of a voltage which exceeds the threshold voltage allows the MOSFET 9 to conduct. Then the voltage applied to the MOSFETs 110 and 111 further rises. When the aforementioned semiconductor region is pinched off as a result of the voltage rise, the resistance value of the variable resistor 122 becomes limitless and the MOSFET 108 is shut down. The MOSFET 9 for the zero-cross operation is operated and maintained with respect to a change in a cyclic alternating voltage.

When an abruptly changing voltage is applied between the first terminal T1 and the second terminal T2 of the optically controlled highly sensitive basic bidirectional three terminal thyristor as shown in FIG. 17, the junction capacitance 25 between the N-type silicon substrate 1 of the phototransistor 8 and the base diffusion region 6 serves as a parasitic capacitance to excite the deviation current i (i=Cj·dV/dt). The deviation current i increases as a voltage change, namely dV/dt between terminals T1 and T2 increases, and the deviation current is inputted to the base of the transistor 8 as a noise to generate an operation error which causes the thyristor 20 to conduct.

In a structure in which the gate voltage of the MOSFET 9 is supplied via a punch-through diode 26 even when a zero-cross control circuit is provided like the equivalent circuit as shown in FIG. 14, a certain amount of time is required to charge the gate of the MOSFET 9 and an operation response of the MOSFET 9 for the zero-cross operation is slow. Consequently, the MOSFET cannot follow a steep dV/dt so that the phototransistor 8 is operated like the equivalent circuit shown in FIG. 17 to generate an operation error which causes the thyristor 20 to conduct.

In a structure in which a punch-through diode as can be seen in the prior art is used, time is required to charge the gate of the MOSFET. As a consequence, the MOSFET has such a disadvantage that the MOSFET becomes slow in operation response and the MOSFET cannot follow an abrupt change in dV/dt to generate an operation error.

Since the photo-bidirectional three terminal thyristor which is described in FIGS. 18 to 20 is such structured that two chips are arranged on one frame, so that there arises a problem that two chips come into contact with each other to become defective or broken into pieces when chips are arranged on one frame for the die-bonding process. Furthermore, a larger number of wires are needed than in one chip structure so that the wire bonding frequency increases and a possibility that a failure in the connection between the wire and the electrode is caused increases and the reliability of the device is lowered. Furthermore, in the case of a two-chip structure, there is a fear that a chip area becomes larger because a sufficient distance has to be taken between a light source of controlling the operation of the thyristor and each chip to operate the two thyristors accurately at the same time.

SUMMARY OF THE INVENTION

An object of the invention is to provide a semiconductor circuit provided with a thyristor which is capable of preventing an operation error and responding at a high speed by adding a circuit capable of clamping an abrupt dV/dt.

The invention provides a semiconductor integrated circuit provided with a thyristor which is integrated with a gate drive circuit on one and the same semiconductor chip, comprising a dV/dt circuit which includes:
  a MOSFET having a drain electrode and a source electrode which are connected between input terminals of the gate drive circuit;
  a capacitor having one end connected to a gate terminal of the thyristor and another end connected to a gate electrode of the MOSFET;
  a constant voltage device connected between the gate electrode and source electrode of the MOSFET; and
  a resistor connected in series to the constant voltage device between the gate electrode and source electrode of the MOSFET.

According to the invention, the drain electrode and source electrode of the MOSFET are connected between the input terminals of the gate drive circuit of the thyristor in the dV/dt clamp circuit. A capacitor is connected between the gate electrode of the MOSFET and the gate terminal of the thyristor. When a signal having a high dV/dt is applied to the gate terminal of the thyristor, an input is provided to the gate electrode of the MOSFET via the capacitor to allow conduction between the gate electrode and the source electrode. By setting the capacitor volume to a value much larger than the parasitic capacitance between the gate electrode and source electrode of the MOS FET, a low impedance state can be maintained against an abrupt change in dv/dt and a pulse-like noise voltage while maintaining the conduction between the drain electrode and source electrode of the MOSFET, thereby preventing an operation error of the gate drive circuit.

Furthermore the invention is characterized in that the constant voltage device is a zener diode, and
  the zener voltage and the resistance value of the resistor are adjusted so that the gate electrode voltage of the MOSFET can be held durably to a level more than a threshold or more for a time longer than a predetermined time.

According to the invention, the constant voltage device connected between the gate electrode and source electrode of the MOSFET is a zener diode, and the zener voltage and the resistance value of the resistor can be adjusted so that the gate electrode voltage of the MOSFET can be maintained more than a threshold for a longer time than a predetermined time, thereby making it possible to allow the MOSFET to conduct for a sufficient time.

Furthermore, the invention is characterized in that the capacitor is formed by providing a dielectric film having a higher dielectric constant than that of a semiconductor oxide film on a substrate of the semiconductor chip, and
  an impurity diffusion layer of a conductive type different from that of the semiconductor chip substrate is arranged on the periphery of the dielectric film.

According to the invention, the capacitor is formed by providing a dielectric film of a high dielectric constant on the semiconductor substrate, so that a relatively large capacitance for the area of the dielectric film can be realized. Since an impurity diffusion layer of a different conductive type is arranged on the periphery of the dielectric film, insulation breakdown voltage between the dielectric film and the semiconductor substrate surrounding the film is enhanced and a higher breakdown voltage of the capacitor is obtained.

Furthermore, the invention is characterized in that the thyristor is a bidirectional three terminal thyristor in which two thyristors for two channel are connected in parallel so as to be arranged in opposite directions to each other.

According to the invention the bidirectional three terminal thyristor which is connected in parallel so that thyristors for two channels are arranged in a direction opposite to each other is prevented from operating erroneously, and power of an alternating current circuit or the like can be controlled in a highly reliable manner.

Furthermore, the invention is characterized in that the thyristors for two channels ire integrated on one and the same semiconductor chip, and
  each of the thyristors is provided with a gate drive circuit and a dV/dt clamp circuit.

According to the invention, an operation error resulting from an input having a high dV/dt can be prevented with reliability even in the case of a higher operation sensitivity set in the thyristors, because the thyristors for two channels integrated on one semiconductor chip are provided with a dV/dt clamp circuit respectively. Furthermore, since the chips are integrated on one semiconductor chip, the number of wires required for connecting to the electrode for power source supply can be reduced.

The invention is characterized in that the gate drive circuit has a zero-cross function.

According to the invention, the gate drive circuit includes a zero-cross function, so that the alternating current is controlled only in the vicinity of the zero-cross point. Thus, an operation error at a position deviated from the zero-cross point resulting from a noise or the like can be prevented with reliability.

Furthermore, the invention is characterized in that the gate drive circuit includes a light receiving, element for optical control.

According to the invention, since a light receiving element for optical control is included in the gate drive circuit, a highly sensitive optical control thyristor can be realized. Even with a higher sensitivity with the light receiving element, an operation error resulting from an input having a high dV/dt can be prevented with reliability.

The invention is characterized in that the light receiving element is a phototransistor, and
the drain electrode and source electrode of the MOSFET are connected between the base electrode and emitter electrode of the phototransistor.

Furthermore, according to the present invention, the light receiving element which is included in the gate drive circuit is a phototransistor, so that more sensitive and optically controllable thyristor can be realized. A so-called BSF structure is not required to be adopted wherein a semiconductor layer formed by allowing a rear surface of the semiconductor chip to contain a large amount of impurity is formed to raise the photosensitivity. Furthermore, an interference between thyristors for two channels can be reduced by shortening the life time of few carriers in the N-type silicon substrate.

Furthermore, the invention is characterized in that the semiconductor integrated circuit further comprises light emitting means capable of transmitting an optical signal for driving the thyristor in a state electrically insulated from the semiconductor chip.

According to the present invention, an operation error resulting from an input having a high dV/dt can be prevented with reliability by locating the light emitting element opposite to the light receiving element or by directing control light toward a light receiving surface of the light receiving element by using an optical fiber cable or the like in an electrically insulated state with the semiconductor chip which constitute a thyristor and a gate drive circuit.

As described above, according to the invention, a voltage having a high dV/dt can be clamped with a series circuit of the capacitor, the constant voltage device and the resistor to prevent an operation error of the thyristor.

Furthermore, according to the invention, the constant voltage device is a zener diode, and the duration time of the gate electrode voltage of the MOSFET can be adjusted by adjusting the zener diode voltage and the resistance value of the resistor to maintain sufficiently the conductive state of the MOSFET which is capable of sufficiently preventing the operation error resulting from an input having a high dV/dt.

Furthermore, according to the invention, a signal voltage sufficient for operating the MOSFET can be supplied to the gate electrode even in the presence of a parasitic capacitance between the gate electrode of the MOSFET and the source electrode thereof because a capacitor with a large capacitance and a high breakdown voltage can be realized in a relatively small area.

Furthermore, according to the invention, the alternating current power can be controlled with a good precision with the bidirectional thyristor.

Furthermore, according to the invention, an operation error resulting from an input having a high dV/dt can be prevented with reliability even when an operation sensitivity of the thyristor is heightened, because the thyristors for two channels integrated on one semiconductor chip are provided with dV/dt clamp circuits respectively. Additionally since thyristors for two channels are integrated on one semiconductor chip, the possibility that chips are broken in the manufacturing process can be decreased and a yield in products can be improved as compared with the case in which the bidirectional three terminal thyristor is formed by die-bonding two chips on one frame. Furthermore, since the chips are integrated on one semiconductor chip, the number of wires required for connection to electrodes can be reduced thereby decreasing the possibility that a disadvantage will be caused from a failure in connection between the wires and the electrode.

Furthermore, according to the invention, the conductive state and the shut-off state are changed over only in the vicinity of the zero-cross at the time of the alternating current power control with the bidirectional thyristor with the result that electric power can be controlled with reliability in a state of a small switching noise.

Furthermore, according to the invention, the gate drive circuit can incorporate a light receiving element to perform a highly sensitive optical control. An operation error resulting from an input having a high dV/dt can be also prevented by incorporating a highly sensitive light receiving element so that a highly sensitive and highly reliable operation can be realized.

Furthermore, according to the invention, since the gate drive circuit includes a phototransistor which is a highly sensitive light receiving element, further more sensitive optically controllable thyristor can be realized. Furthermore, it is not necessary to form a semiconductor layer which includes a large amount of impurity on the rear surface of the semiconductor chip to raise the photosensitivity. When a bidirectional three terminal thyristor is constituted on one semiconductor chip for connecting the two thyristors in parallel in a direction opposite to each other, an interference between thyristors for two channels can be reduced and the commutation characteristic can be improved as well.

Furthermore, according to the invention, the electric power can be controlled with a high reliability in a state in which an electric power system controlled by using an optical signal and a control signal system are electrically insulated to each other.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
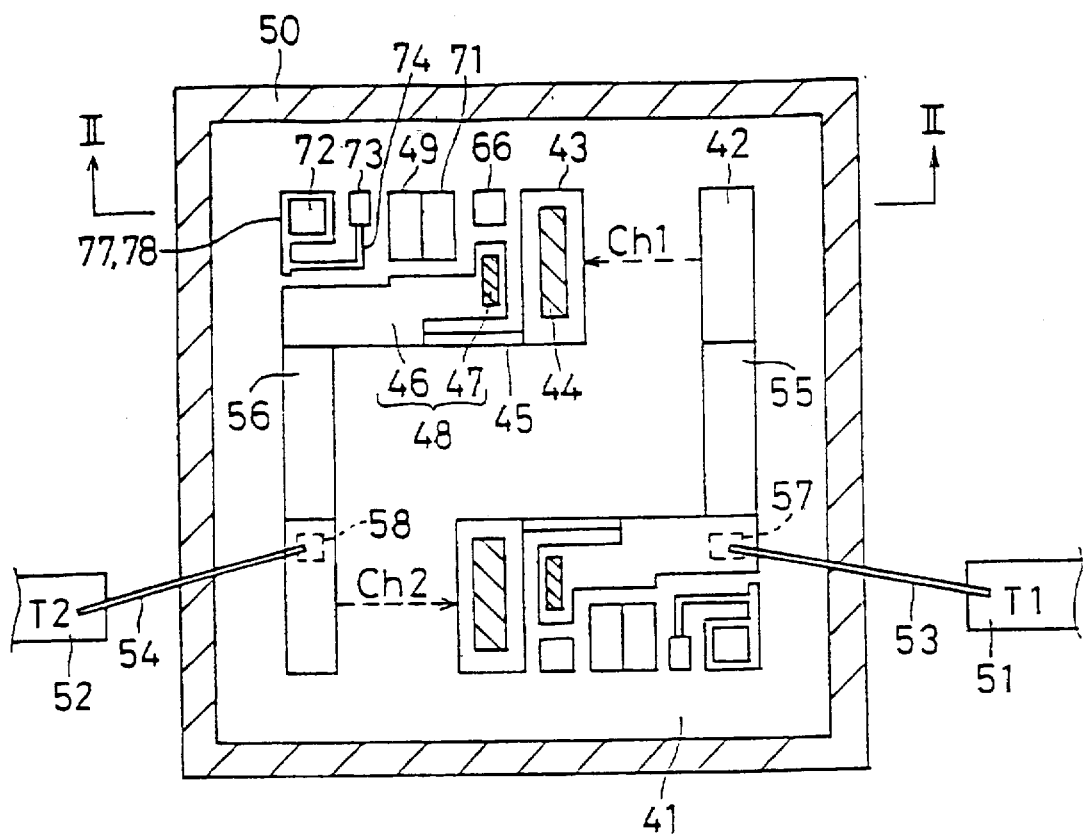
FIG. 1 is a schematic plane view showing one embodiment of the invention.

Now referring to the drawings, preferred embodiments of the invention are described below.

Figure 2:
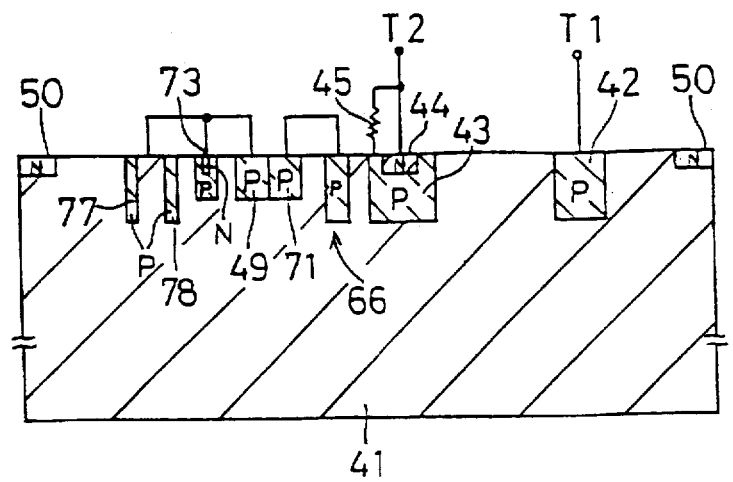
FIG. 2 is a sectional view of FIG. 1 taken along sectional line II—II of FIG. 1.

FIGS. 1 and 2 show one embodiment of the invention when the invention is applied to cl highly sensitive type photo-bidirectional three terminal thyristor provided with a zero-cross function. FIG. 1 is a schematic plane view of the embodiment, and FIG. 2 is a sectional view of the embodiment taken along sectional line II—II of FIG. 1.

An N-type silicon substrate 41 includes a P-type anode diffusion region 42, a P-type gate diffusion region 43 and an N-type cathode diffusion region 44 which is formed in the gate diffusion region 43. These diffusion regions form a basic structure of a PNPN-type reverse blocking thyristor. The basic structure of the thyristor is formed in a pair of channel 1 and channel 2, thereby constituting a bidirectional three terminal thyristor. A P-type impurity is diffused into a predetermined region between the gate diffusion region 43 and the cathode diffusion region 44 to form a gate resistor 45.

The gate drive circuit includes a base diffusion region 46 and an emitter diffusion region 47. The gate drive circuit provides a phototransistor 48 having an N-type silicon substrate which serves as a collector, arid a MOSFET 49. On the periphery of the N-type silicon substrate 41, an N-type channel stopper 50 is provided. Outside of the N-type silicon substrate 41, are formed first and second electrodes T1 and T2 as output terminals of the bidirectional three terminal thyristor by using the terminal frames 51- and 52.

One ends of wires 53 and 54 are joined with the terminal frames 51 and 52, respectively, while the other ends are joined with bonding pads 57 and 58, respectively, which are provided on Al wirings 55 and 56. The first electrode T1 and the second electrode T2 are electrically connected to the anode diffusion region 42 and the cathode diffusion region 44, respectively. Incidentally, a MOSFET 71 of the dV/dt clamp circuit 70 which will be described later is also formed together with the MOSFET 49.

Figure 3:
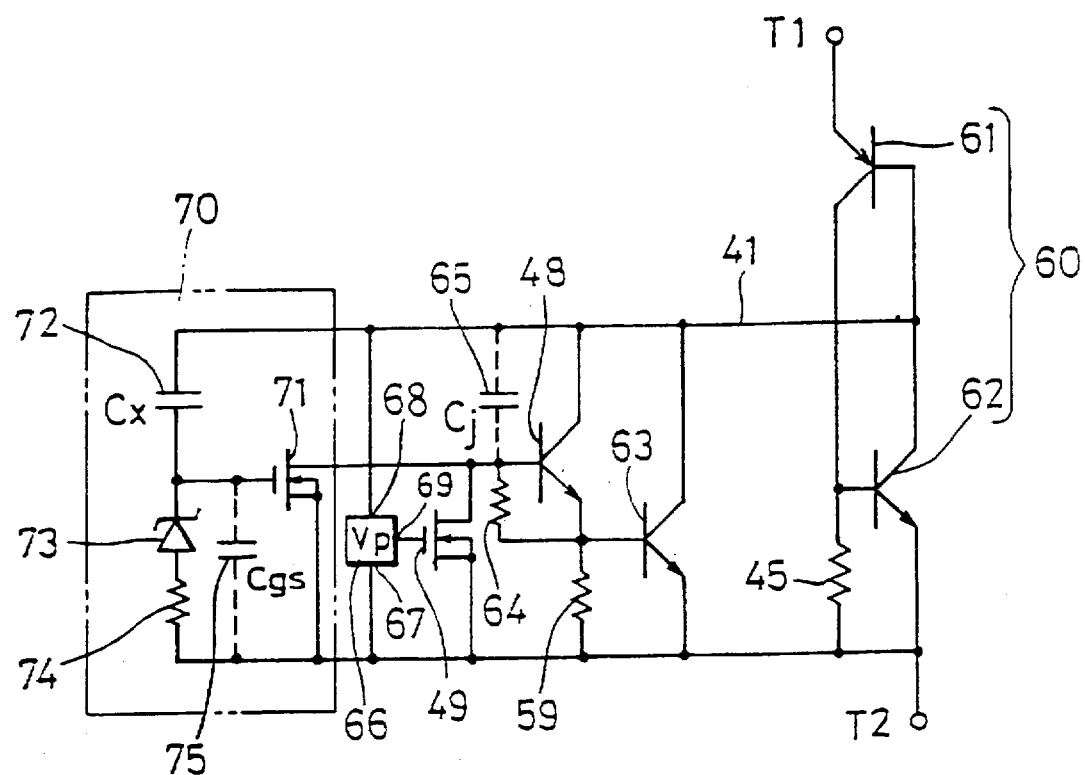
FIG. 3 is an electric circuit diagram showing an schematic electric circuit of the embodiment of FIG. 1.

FIG. 3 is a view showing an electric structure of an equivalent circuit which corresponds to the embodiment of FIGS. 1 and 2. The equivalent circuit is shown as a drive circuit of the bidirectional three end terminal thyristor for only one channel. However, the drive circuit for the other channel is the same as the counterpart for the former channel. The thyristor 60 comprises an equivalent PNP transistor 61 and an equivalent NPN transistor 62. A base of the equivalent PNP transistor 61 is connected to a collector of the equivalent NPN transistor 62. A collector of the equivalent PNP transistor 61 is connected to a base of the equivalent NPN transistor 62. An emitter of the equivalent PNP transistor 61 is connected to a first electrode T1 while an emitter of the equivalent NPN transistor 62 is connected to the second electrode T2.

The gate resistor 45 is inserted between the base of the equivalent NPN transistor 62 and the emitter thereof. The N-type silicon substrate 41 corresponds to a connection point of the base of the equivalent PNP transistor 61 and the collector of the equivalent NPN transistor 62, and the N-type silicon substrate constitutes a control input Line of the thyristor 60.

A collector and an emitter of an output transistor 60 are connected between the N-type silicon substrate 41 and the emitter of the equivalent NPN transistor 62. The output transistor 63 and the phototransistor 48 constitute a Darlington circuit. An input resistor 59 is connected to the base and emitter of the phototransistor 48. Since the Darlington circuit formed of the phototransistor 48 and the output transistor 63 is connected to the input control of the thyristor 60, the electric power can be controlled in a state of high sensitivity to light.

A deviation current i flows into the base of the phototransistor 48 via a junction capacitance (Cj) 65. To the base of the phototransistor 48 is connected a drain of the MOSFET 49 for zero-cross control. A cathode terminal 68 of the punch-through diode 66 is connected to a source of the MOSFET 49, the anode terminal 67 is connected to a control input line of the thyristor 60, and a gate terminal 69 is connected to a gate of the MOSFET 49. The anode terminal 67 is further connected to an emitter of the output transistor 63 and the second electrode T2.

Furthermore, a dV/dt cl-amp circuit 70 is connected to the base of the phototransistor 48. The dV/dt clamp circuit 70 includes the MOSFET 71, a high breakdown voltage capacitor 72, a zener diode 7.3 and a resistor 74. A drain of the MOSFET 71 is connected to the base of the phototransistor 48. To the gate of the MOSFET 71 are connected the high breakdown voltage capacitor 72 and a parasitic volume (Cgs) 75. The zener diode 73 and the resistor 74 are connected in series. The cathode of the zener diode 73 is connected to the gate of the MOSFET 71 while the anode thereof is connected to one end of the resistor 74. Another end of the resistor 74 is connected to a source of the MOSFET 1 and further to the second electrode T2.

When a voltage which is given to a control input line of the thyristor 60 abruptly changes, a voltage distributed in correspondence to a ratio of an inverse number of the capacitance of the high breakdown voltage capacitor 72 and the parasitic capacitance is applied to the gate of the MOSFET 71. This voltage is held for a duration time which can be adjusted with the series circuit of the zener diode 73 and the resistor 74.

Figure 4:
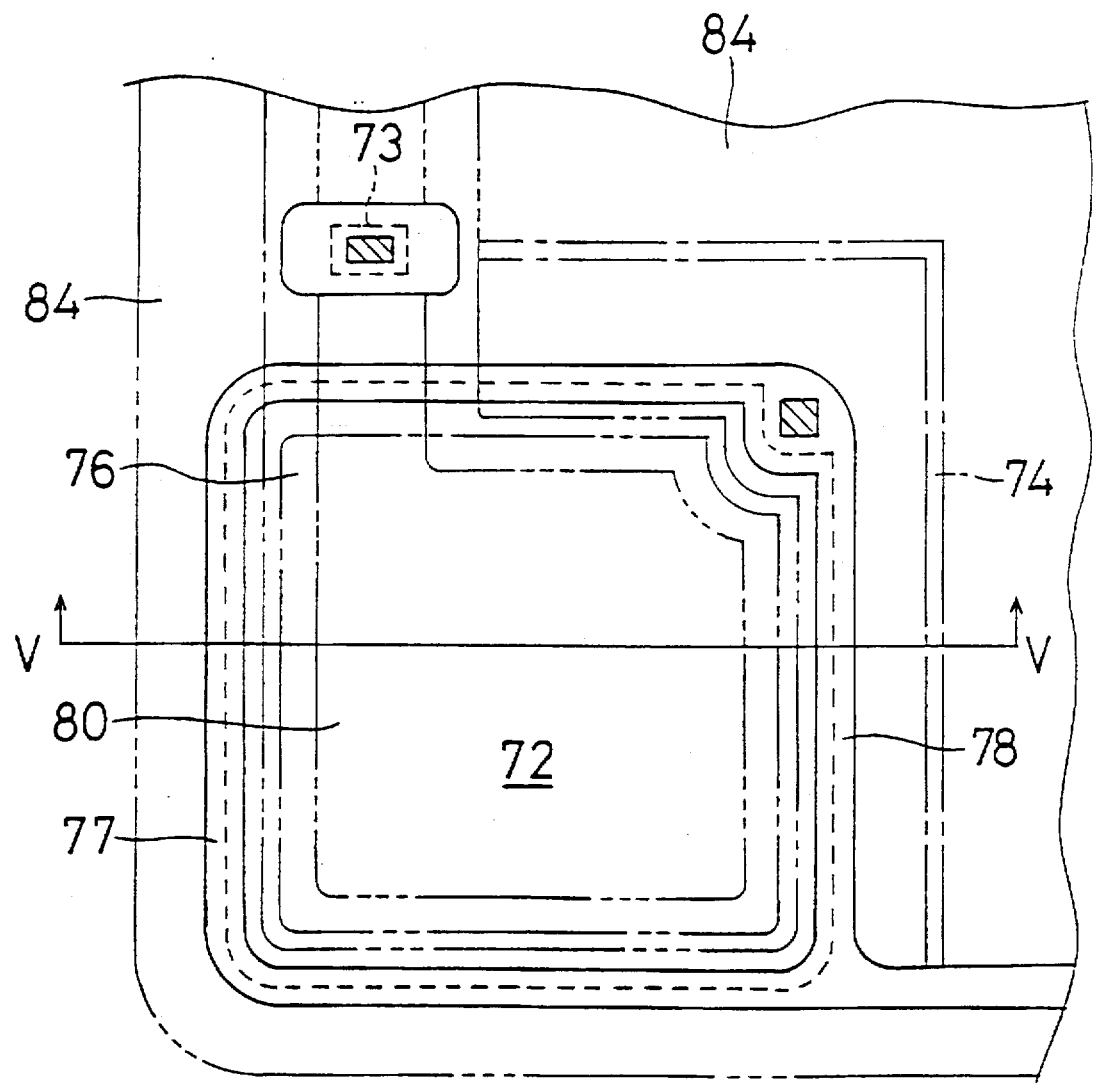
FIG. 4 is a plane view showing a structure which is related with a dV/dt clamp circuit 70.
Figure 5:
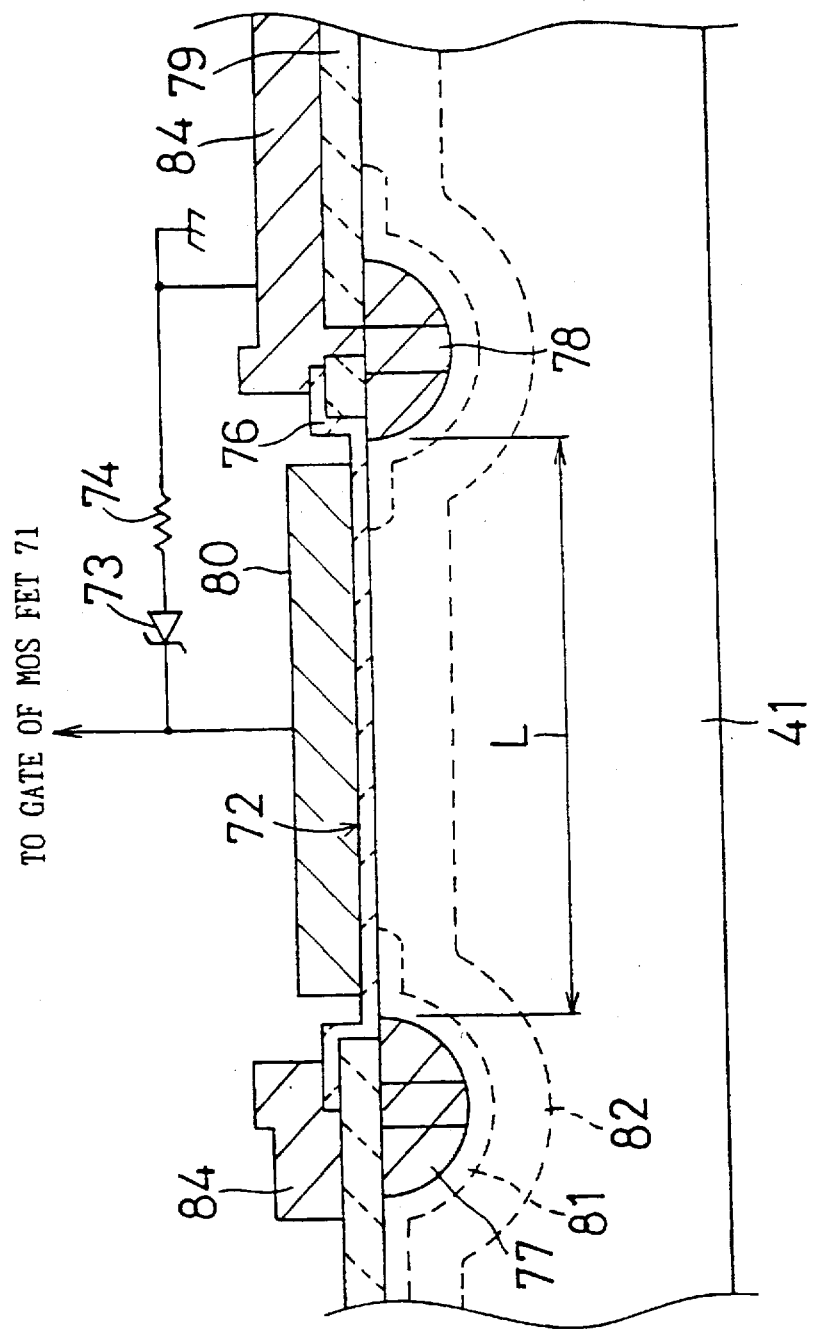
FIG. 5 is a sectional view showing the structure which is related with the dV/dt clamp circuit 70.

FIG. 4 is an enlarged plane view showing a part which is related with a high breakdown voltage capacitor 72 shown in the plane view of FIG. 1. FIG. 5 is a view showing a sectional structure thereof. The high breakdown voltage capacitor 72 is formed on an N-type silicon substrate using silicon nitride (SiN) including $Si_3N_4$ as a dielectric film 76. Then an electrode 80 is formed thereon. The thickness of the dielectric film 76 is set to, for example, about 700 angstrom.

Since silicon nitride which has a higher dielectric rate than that of the silicon oxide film 76 is used as the dielectric film 76, an area which is required for forming a high breakdown voltage capacitor 72 can be reduced to a relatively small area. To enhance a breakdown voltage of the high breakdown voltage capacitor 72, P-type diffusion layers 77 and 78 are formed on the periphery of the dielectric film 76. Between the dielectric film 76 and the P-type diffusion layers 77 and 78 a silicon oxide film 79 is provided. An electrode 80 is formed on the upper part of the dielectric film 76.

The cathode of the zener diode 73 and the gate of the MOSFET 71 are connected to the electrode 80. Inside of the N-type silicon substrate 41 located below the dielectric film 76, a depletion layer 81 or a depletion Layer 82 is formed in accordance with a voltage given to the electrode 80. Above the P-type diffusion regions 77 and 78, an electrode 84 is formed to be connected to the second electrode T2 shown in FIG. 3.

Since the gate potential of the MOSFET 71 is determined by a capacitance ratio of the capacitance Cgs of the parasitic capacitance 75 vs. the capacitance Cx of the high breakdown voltage capacitor 72, it is desirable that the capacitance Cx of the high breakdown voltage capacitor 72 is large enough to allow the disregard of the capacitance Cgs of the parasitic capacitance 7.

When a positive voltage is applied to the N-type silicon substrate 41, current is supplied to the gate of the MOSFET 71 from the dielectric film 76 via the electrode 80. The current supplied to the gate raises the potential of the gate electrode to allow the MOSFET to conduct.

When a voltage remains to be applied to the electrode 80, there arises a disadvantage in that the insulation of the dielectric film 76 is broken down. The P-type diffusion layers 77 and 78 are provided in order to prevent the insulation breakdown of the dielectric film 76 caused by the application of a high voltage thereto. When an alternating current is applied to the first and second electrodes T1 and T2 by forming the P-type diffusion layers 77 and 78, the junction of the surrounding P-type diffusion layers 77 and 78 with the N-type silicon substrate 41 is reversely biased, so that a depletion layer is grown in the order from 81 to 82. When the depletion layer is connected together as shown in a state 82, no voltage will be applied to the dielectric film 76. Therefore, the insulation breakdown of the dielectric film 76 can be prevented. Furthermore, at the same time, no voltage is applied to the dielectric film 76, so that no current is supplied to the gate of the MOSFET 71. Then a discharge of electric charges accumulated in the high breakdown voltage capacitor 72 will be started.

When a distance L between the P-type diffusion layers 77 and 78 is too short, the electrostatic capacitance Cx of the high breakdown voltage capacitor 72 will be reduced and the deviation current i will be reduced. Thus, the gate voltage of the MOSFET will not rise to a predetermined threshold value so that there arises a disadvantage such that the MOSFET 71 does not conduct. In addition, when the distance L is too long, the depletion layer 81 is not connected as it is with the result that there arises a disadvantage such that the breakdown voltage will be lowered and the insulation of the dielectric film 76 will be broken down. Consequently, it is necessary to optimize the value of the distance L.

Figure 6:
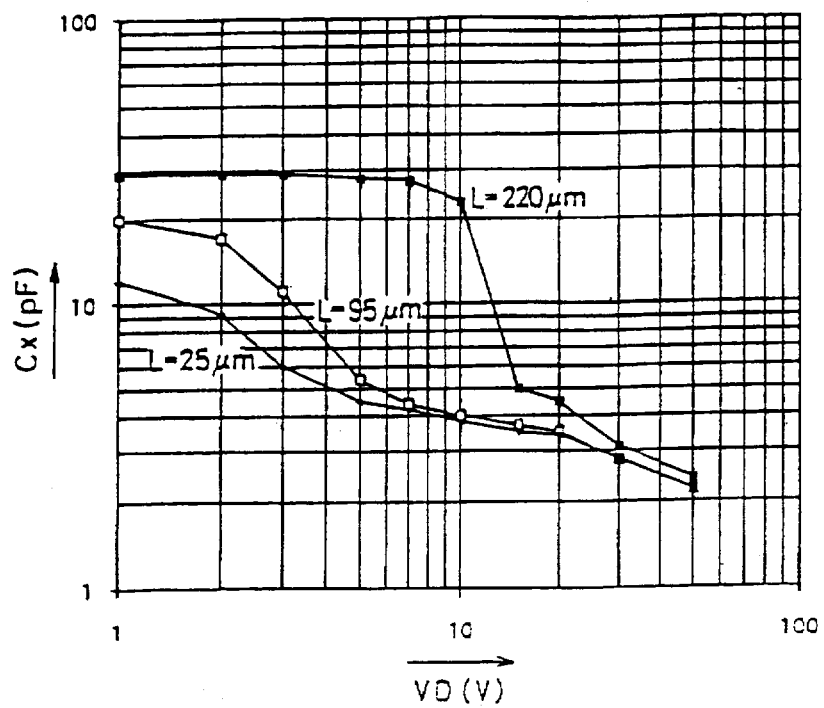
FIG. 6 is a graph showing a relation between an electrostatic capacitance Cx and a voltage VD of a high breakdown voltage capacitor 72 in the dV/dt clamp circuit 70.

FIG. 6 shows a relation between the electrostatic capacitance Cx (pF) of the high breakdown voltage capacitor 72 and a voltage VD (V) between the anode and cathode of the thyristor as a diode when the thyristor is biased in an opposite direction, by using the distance L between the P-type diffusion layers 77 and 78 as a parameter.

When the VD value exceeds a certain value, each of the depletion layer 81 is connected to each other to form the depletion layer 82 so that only the junction capacitance remains, and thus the capacitance is decreased. With a decrease in the capacitance, the current supplied from the high breakdown voltage capacitor 72 is decreased and the gate voltage of the MOSFET 71 is decreased so that it is feared that the MOSFET 71 might be interrupted and the phototransistor 48 might be operated in a wrong way. To improve such state, it is required that the decrease in the gate voltage of the MOSFET 71 is suppressed as much as possible to maintain the gate voltage thereof.

As means for suppressing the decrease in the gate voltage 71, the following ways are given; 1) to reduce the thickness of the oxide film of the MOSFET 71 as much as possible to raise the amount of the electric charge, 2) to enlarge the zener breakdown voltage of the zener diode to prevent the gate voltage of the ) MOSFET 71 from being decreased by the current at the time of the break-over, 3) to reduce a device leak of the zener diode 73 and 4) to reduce the parasitic capacitance Cgs.

In an actual design of the zener diode 73, an object of the zener diode 73 is to prevent the insulation breakdown. The aforementioned items 1) and 2) are opposite to each other. The breakdown voltage of the zener diode 73 is set to about 400 to 1000V, for example 800V or more. The zener breakdown voltage is limited to about 20 to 50V. To compensate for this zener breakdown voltage, the resistor 74 is connected in series. With the adjustment of the resistance value, a decrease in the gate voltage of the MOSFET 71 is suppressed. While a small resistance value of the resistor 74 is favorable in relation to the breakdown of the insulation film of the gate electrode, a large resistance value is favorable in relation to the duration of the gate voltage. Consequently, it is necessary that the resistance value of the resistor 74 is optimized.

Figure 7:
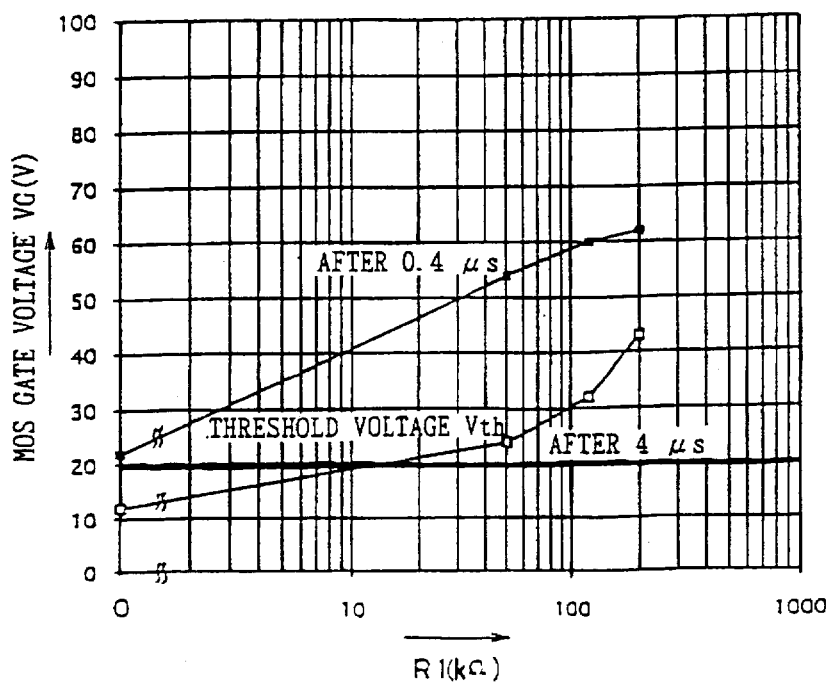
FIG. 7 is a graph showing a dependency of a gate voltage of a MOSFET 71 in the dV/dt clamp circuit 70 upon a resistance value of a resistor 74.

FIG. 7 shows a dependency of the gate voltage VG of the MOSFET 71 upon the resistance value R1 (kΩ) of the resistor 74. A change in the gate voltage VG with respect to the passage of time is determined by a time constant defined by the resistance value R1 and the capacitance Cx of the high breakdown voltage capacitor 72. While the time constant needs to be enlarged to delay the decrease in the gate voltage VG, the area of the dielectric film needs to be enlarged to enhance the capacitance Cx, thereby enlarging a chip area where the thyristor is formed. Consequently, the time constant is adjusted with the resistance value R1 of the resistor 74.

To operate normally the other devices which are connected to the rear half of the dV/dt clamp circuit 70, it is required that the MOSFET 71 remains in a conducting state to about 4 μS after a voltage is applied to the first and second electrodes Ti and T2. In other words, it is necessary to design the MOSFET so that the gate voltage VG is kept at the threshold voltage Vth or more of the MOSFET 71.

The measurement conditions were defined as follows; the capacitance of the high breakdown voltage capacitor 72 is set to Cx=33pF, the zener voltage of the zener diode 73 is set to 22V, the voltage between the anode and the cathode of the thyristor 60 is set to VD=570V, and the threshold voltage Vth of the MOSFET 71 is set to 20V in consideration of an error in the device.

The gate voltage VG after the lapse of 0.4 μs exceeds the threshold voltage Vth even ashen the resistance value R1 is set to any value. Consequently, in the case where the resistor 74 having any resistance value is used, the MOSFET 71 can be operated. The gate voltage VG after the lapse of 4 μs is set to about 12V which is less than the threshold value Vth when the resistance value R1 is 0 Ω. The gate voltage VG after the lapse of 4 μs exceeds the threshold value Vth only when the resistance value R1 is set to a value which exceeds about 20 kΩ.

When the thyristor is actually formed, the resistance value R1 of the resistor is set to about 10 kΩ to 1MΩ, for example, 200KΩ in consideration of distribution in properties of each resistor depending on the P-type diffusion concentration and the depth of the diffusion. The gate voltage after the lapse of 4 μs at the time when the resistance value R1 exceeds about 200 kΩ is set to about 43V which far exceeds the threshold voltage Vth.

The zero-cross circuit comprising the MOSFET 49 and a punch-through diode 66, and the dV/dt clamp circuit 70 have a source and a drain which are respectively connected to the base and the emitter of the phototransistor 48. In the beginning, when a voltage having a high dV/dt is applied, the MOSFET 71 in the dV/dt clamp circuit 70 is operated so that the MOS FET 71 conducts at a high speed. Then, after the operation of the dV/dt clamp circuit 70, the MOSFET 49 for the zero-cross circuit will be operated. The dV/dt clamp circuit 70 has a dV/dt breakdown voltage of about 10 kV/μs and an operation speed thereof is fast. Although the zero-cross circuit operates at a speed slower than the dV/dt clamp circuit 70, the circuit can be operated as a speed enough to track sufficiently 50 MHz and 60 MHz which are commercially available alternating current frequencies.

The MOSFET 71 of the dV/dt clamp circuit 70 is fabricated together with the zero-cross MOSFET 49, it is necessary to set the MOSFET 71 to an ON resistance value in consideration of the resistance value of the input resistor 64 in the phototransistor 48. The resistance is set to a predetermined value depending on the channel length, the channel width, and a surface concentration of a well. The thickness of the MOS gate insulation film is set to 3000 angstrom in consideration of the insulation breakdown. The zener diode 73 of the dV/dt clamp circuit 70 adjusts the zener voltage to about 20 to 70V depending on the P-type diffusion concentration and the diffusion depth. The dV/dt clamp circuit 70 and the zero-cross circuit and the zero-cross circuit are incorporated in each one channel which constitutes a photo-bidirectional three terminal thyristor.

As described above, in accordance with the embodiment, since the dV/dt clamp circuit 70 is operated at a high speed against a steep dV/dt and a pulse-like voltage noise, an operation error of the thyristor can be prevented. In the conventional structure, a snubber circuit must be provided outside to compensate for the low dV/dt breakdown voltage. In the embodiment, such snubber circuit is not required, thereby providing an effect of cost reduction.

Furthermore, the high breakdown voltage capacitor 72 which constitutes the dV/dt clamp circuit 70 requires a breakdown voltage of about 400 to 1000V, for example, 800V or more. As a structure for surrounding the periphery of the dielectric film 76 formed of silicon nitride with a P-type diffusion layers 77 and 78, the high breakdown voltage capacitor can simultaneously realizes a high breakdown voltage and the prevention of the insulation film breakage. To compensate for an abrupt reduction in the capacitance resulting from the structure of the high breakdown voltage capacitor 72, the zener diode 73 and the resistor 74 are added. The insulation breakdown is prevented by optimizing the zener voltage of the zener diode 23 and the resistance value of the resistor 74. At the same time, it is possible to maintain the threshold voltage by suppressing the reduction of the gate potential of the MOSFET 71 as much as possible.

Figure 8:
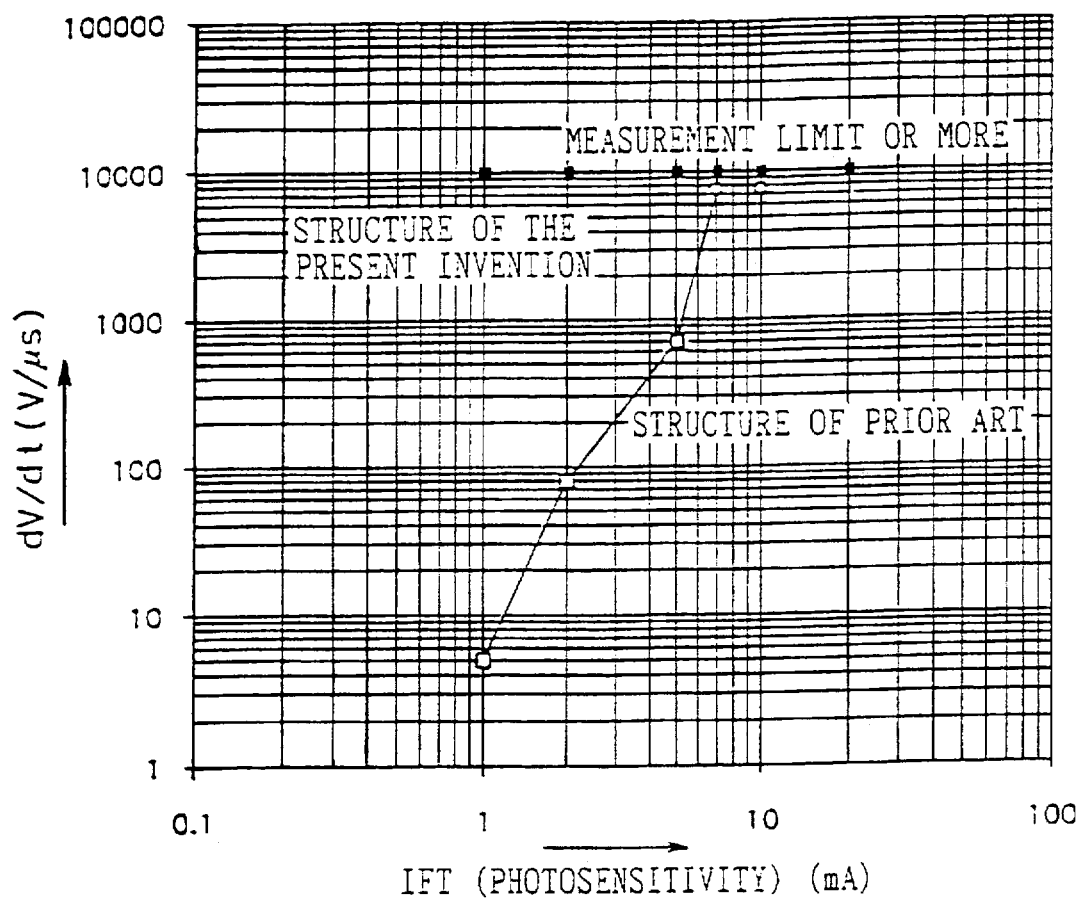
FIG. 8 is a graph showing a dependency of dV/dt characteristics on a photoconductivity of the photo-bidirectional three terminal thyristor of FIG. 3.

FIG. 8 shows a dependency characteristic of the breakdown dV/dt (V/μs) upon IFT (photosensitivity) (mA). The breakdown dV/dt becomes higher with smaller photosensitivity. In the conventional structure, the breakdown dV/dt will be lower with smaller photosensitivity. However, in accordance with the present embodiment, the breakdown dV/dt will not be decreased even when the photosensitivity becomes higher. Furthermore, the breakdown voltage of the photothyristor is about 600V at an IFT of 7 through 10 mA in the prior art whereas in the structure of the invention the breakdown voltage becomes about 800V at an IFT of 3 mA, and it is presumed that the breakdown voltage can be 1000V at an IFT of 1 mA in the future.

Figure 9A:
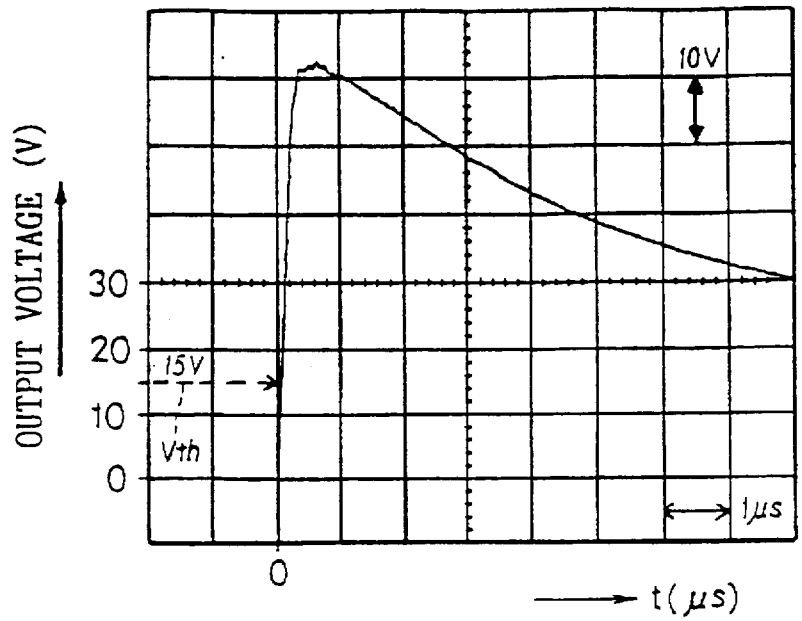
FIGS. 9A and 9B are graphs showing a response characteristics of the dV/dt clamp circuits 70 and 104 at the time when a relatively high voltage is inputted to the circuits.
Figure 9B:
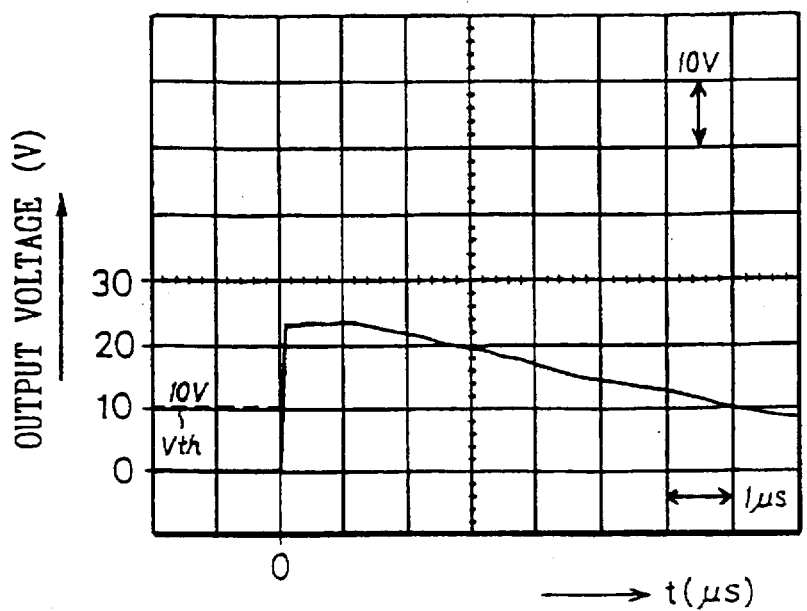
Figure 10A:
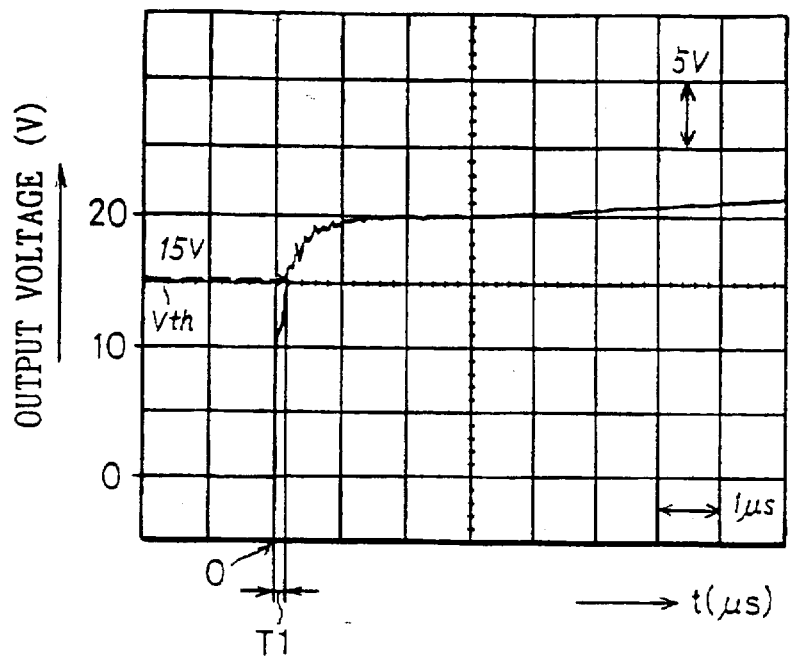
FIGS. 10A and 10B are graphs showing a response characteristics of the dV/dt clamp circuits 70 and 104 at the time when a relatively low voltage is inputted to the circuits.
Figure 10B:
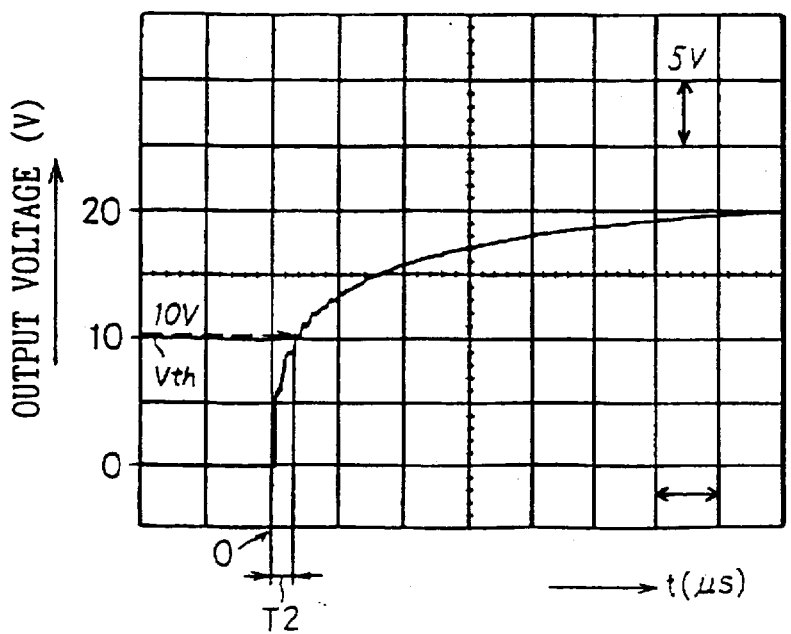

FIGS. 9A and 9B show response characteristics of the dV/dt clamp circuits 70 and 104 when a relatively high voltage is inputted to the circuits. Figs. 10A and 10B show response characteristics of the dV/dt clamp circuits 70 and 104 when a relatively low voltage is inputted. The ordinate shows an output voltage which is represented in terms of volts while one division in the abscissa shows 10V in FIGS. 9A and 9B and 5V in FIGS. 10A and 10B. The abscissa shows time which is presented in terms of μs. One division in the ordinate direction is set to 1 μs both in FIGS. 9A, 9B, 10A and 10B. A threshold voltage Vth of the dV/dt clamp circuit 70 showing characteristic (1) is 15V while the threshold voltage Vth of the dV/dt clamp circuit 104 showing the characteristic (2) is 10V.

When a relatively high voltage of 570V is applied to the dV/dt clamp circuits 70 and 104, the output of the dV/dt clamp circuits 70 and 104 instantly exceeds the threshold voltage Vth. It is possible to regard that the response characteristics is approximately equal. Furthermore, 7 μs after a voltage is applied to the dV/dt clamp circuit 104, the output is set to the threshold voltage Vth or less while the dV/dt clamp circuit still outputs a voltage of about 30V after the lapse of 8 μs.

When a relatively low voltage of 50V is applied to the dV/dt clamp circuits 70 and 104, it takes about 180 ns as time T1 required from the application of the voltage until the voltage exceeds the threshold voltage Vth. Furthermore, in the dV/dt clamp circuit 70, time needed until the voltage exceeds the threshold voltage Vth is about one half, which means that the response is fast despite the high threshold voltage.

Since the zener diode 73 and resistor 74 are connected in series in the dV/dt clamp circuit 70 in the bidirectional three terminal thyristor of the invention as described above, the operation at the time of application of a relatively low voltage is fast with respect to the dV/dt clamp circuit 104 in which the zener diode 112 and the variable resistor 122 are connected in parallel with the result that an operation error of the bidirectional three terminal thyristor can be prevented with reliability.

When the bidirectional three terminal thyristor drives a low load, the ON current phase is delayed from the phase of the alternating current so that the redundant carrier which resides in the substrate moves to the side of the channel 2 when the channel 1 is turned off thereby generating a so-called commutation failure in which the bidirectional three terminal thyristor is turned on by mistake.

Furthermore, when the operation of the bidirectional three terminal thyristor is optically controlled, an $N^+$-type layer with a high impurity concentration may be formed on the rear surface of the N-type silicon substrate 41 for example shown in FIG. 2 to enhance the photosensitivity. A concentration difference between the $N^+$-type layer and the N-type silicon substrate 41 generates a potential difference. Since the carrier which reaches the rear surface is pushed up again to the rear surface, the photo-sensitivity rises. However, when the $N^+$-type layer is formed, the life time of the carrier in the N-type silicon substrate 41 is prolonged, and the commutation characteristic is deteriorated so that the commutation failure is likely to be generated.

Figure 18:
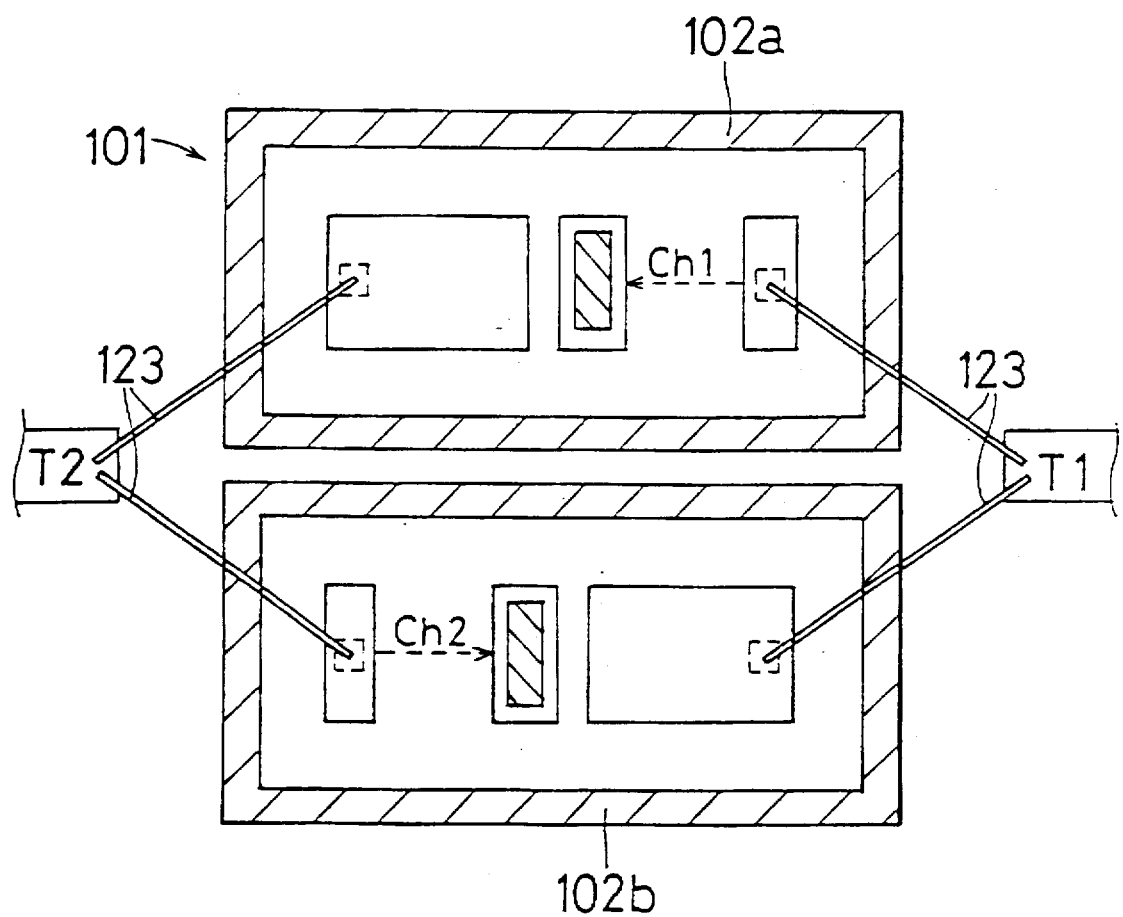
FIG. 18 is a schematic plane view of a photo-bidirectional three terminal thyristor manufactured by Siemens AG.
Figure 19:
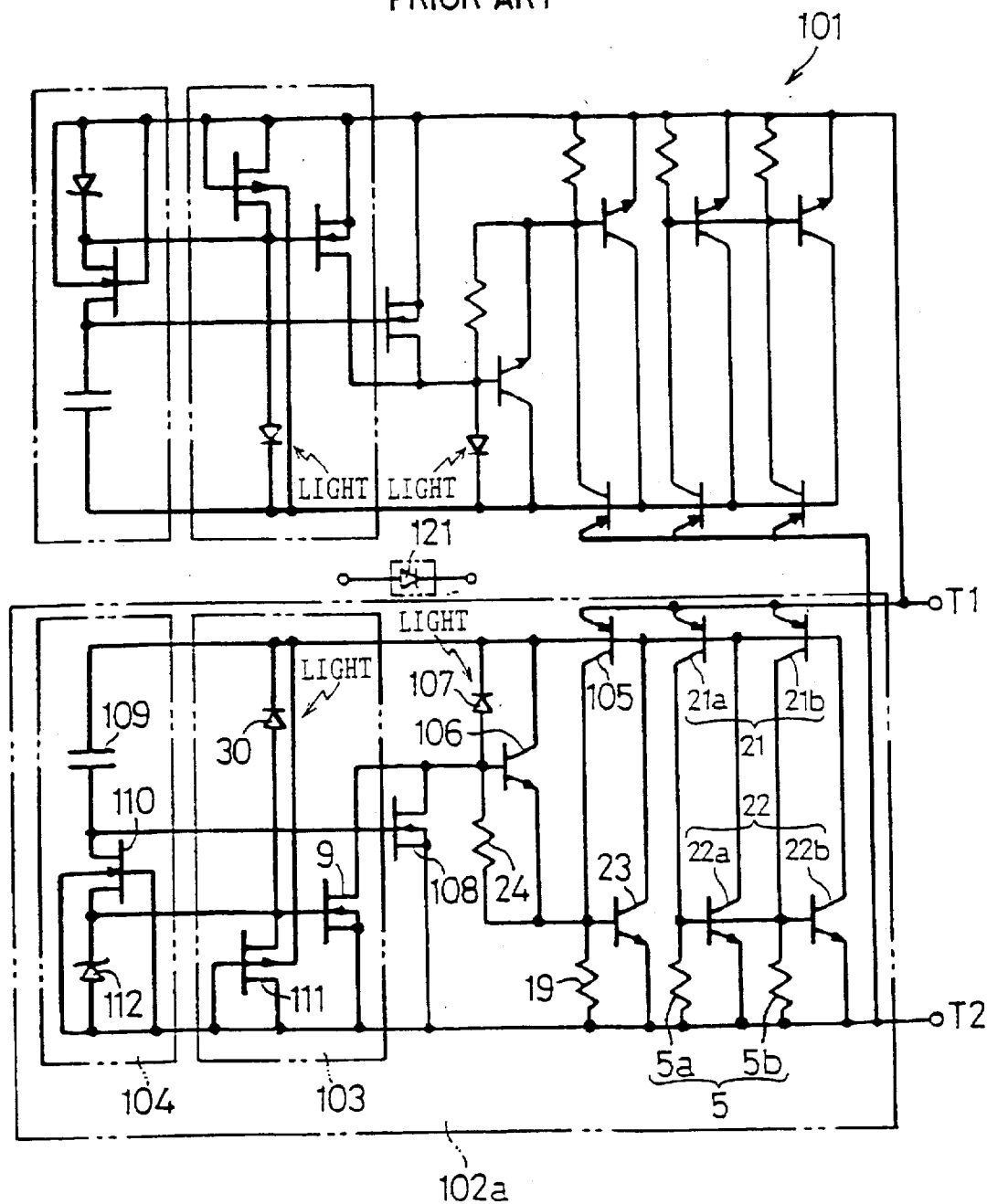
FIG. 19 is an equivalent circuit diagram of the photo-bidirectional three terminal thyristor which is described in a technical document of Siemens AG.
Figure 20:
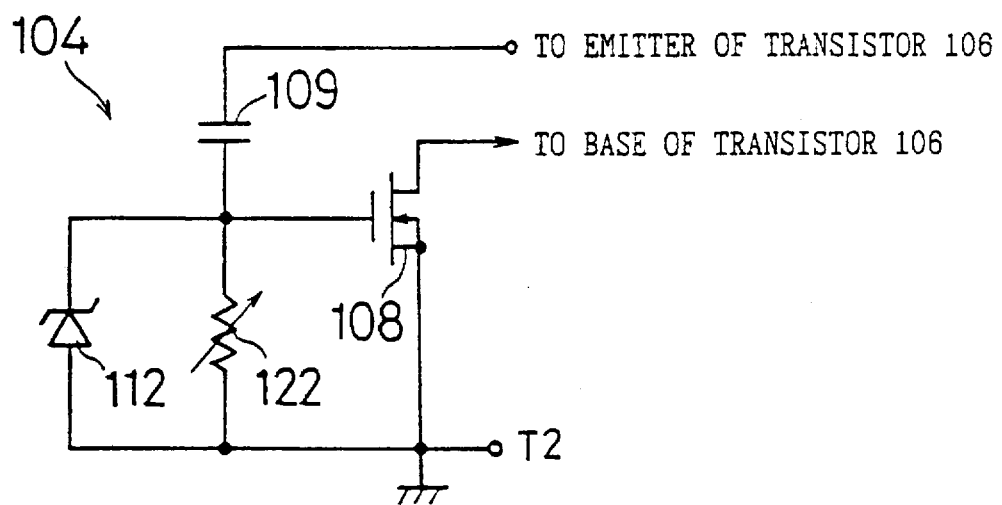
FIG. 20 is an equivalent circuit diagram showing the dV/dt clamp circuit 104 which is included in the photo-bidirectional three terminal thyristor of FIG. 18.

To heighten the photosensitivity while preventing the deterioration in the commutation characteristic, a method is available which comprises forming on one chip each thyristor such as a photo-bidirectional three terminal thyristor which is described from FIGS. 18 through 19, arranging two chips on one frame and connecting the two chips to each other with wires. As described above, it is feared that various disadvantages will be generated when the bidirectional three terminal thyristor is constituted with two chips.

With the bidirectional three terminal thyristor of the invention, the photosensitivity is heightened by providing a phototransistor 48 as a device for controlling the operation of the thyristor. On the rear surface of the N-type silicon substrate 41, no $N^+$-type layer is formed. Furthermore, a layout is optimized for arranging each thyristor on the chip and a distance between channels is widened to prevent the generation of an interference between channels. Consequently, the bidirectional three terminal thyristor of the invention realizes a heightened photosensitivity and a high commutation characteristics with one chip.

Figure 11:
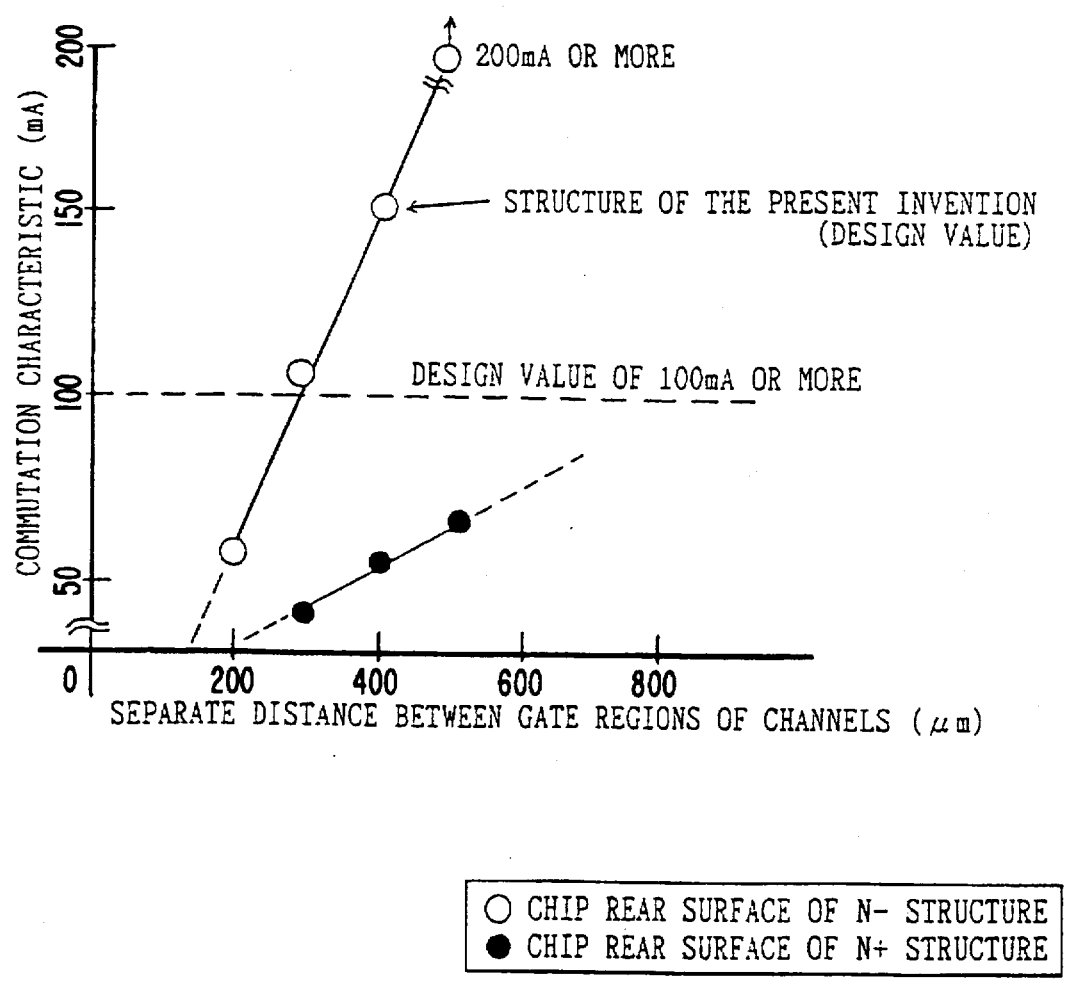
FIG. 11 is a graph showing a relation between a separate distance of gate regions in each channel and a commutation characteristics.
Figure 12:
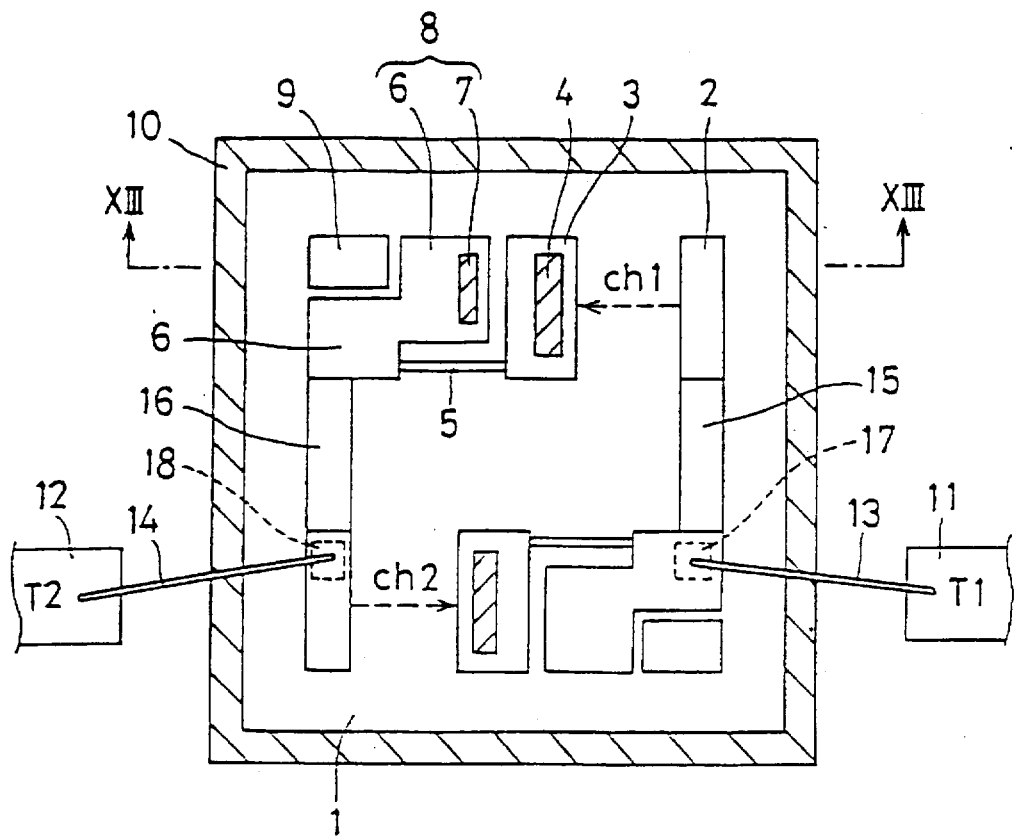
FIG. 12 is a schematic plane view showing a semiconductor integrated circuit including a thyristor of the prior art.
Figure 13:
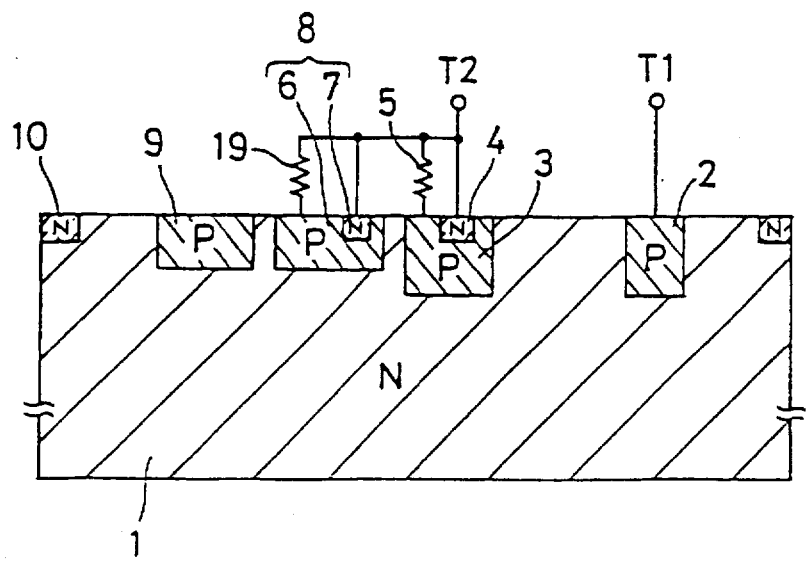
FIG. 13 is a sectional view taken along two sectional lines XIII—XIII of FIG. 12.
Figure 14:
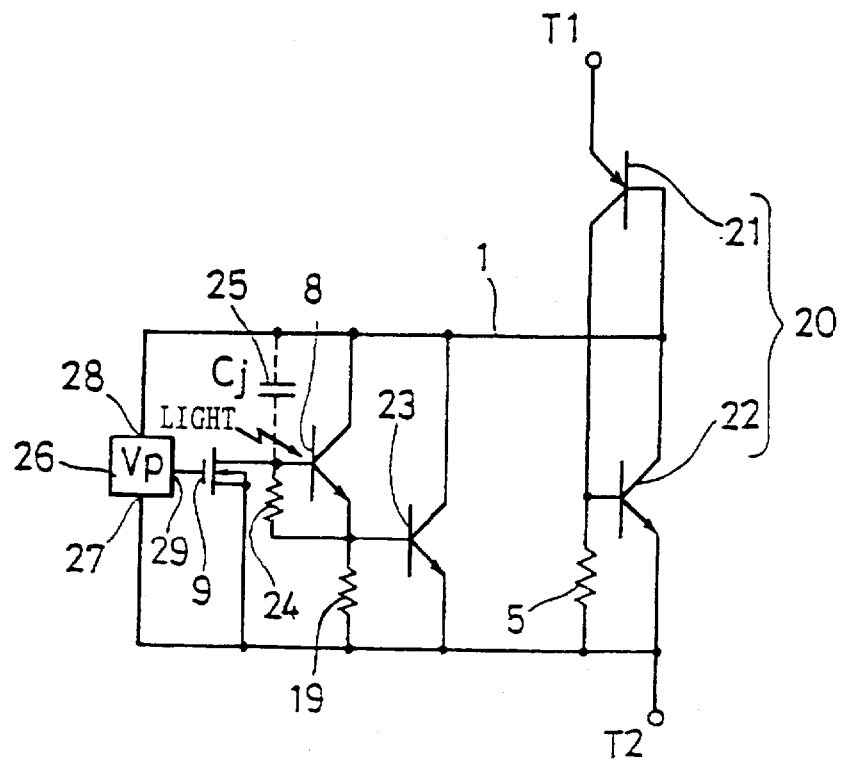
FIG. 14 is an equivalent circuit diagram of the semiconductor integrated circuit of FIG. 12.
Figure 15:
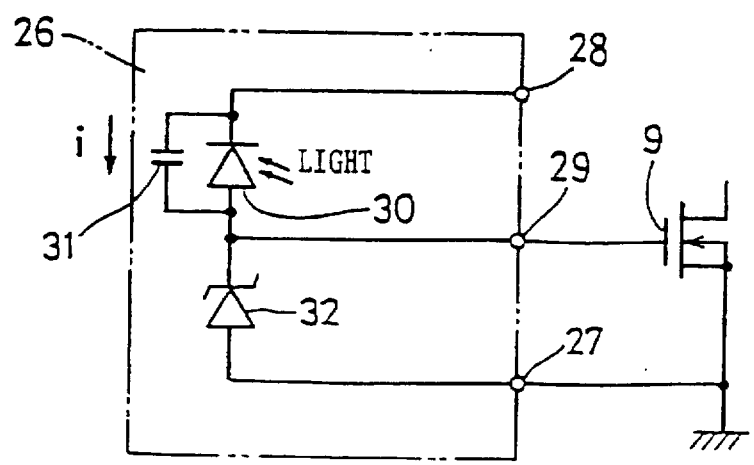
FIG. 15 is a equivalent circuit diagram of a punch-through diode 26 of FIG. 12.
Figure 16:
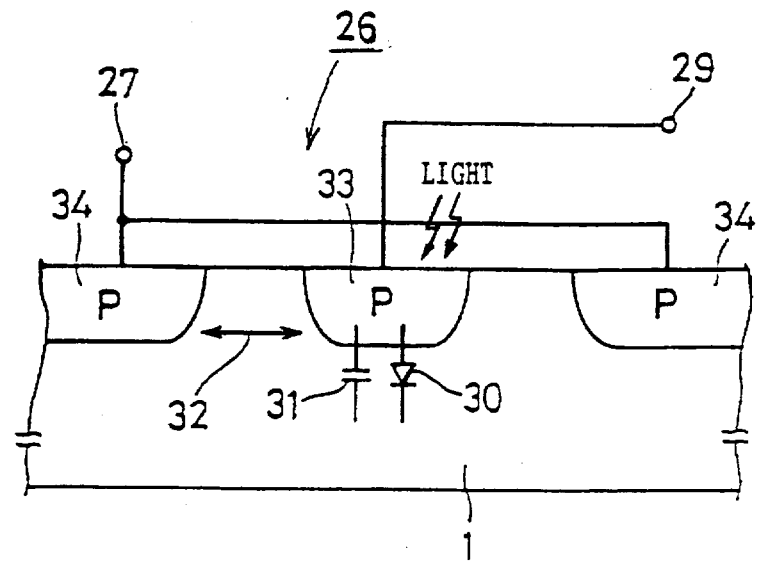
FIG. 16 is a partial sectional view of the punch-through diode 26 of FIG. 12.
Figure 17:
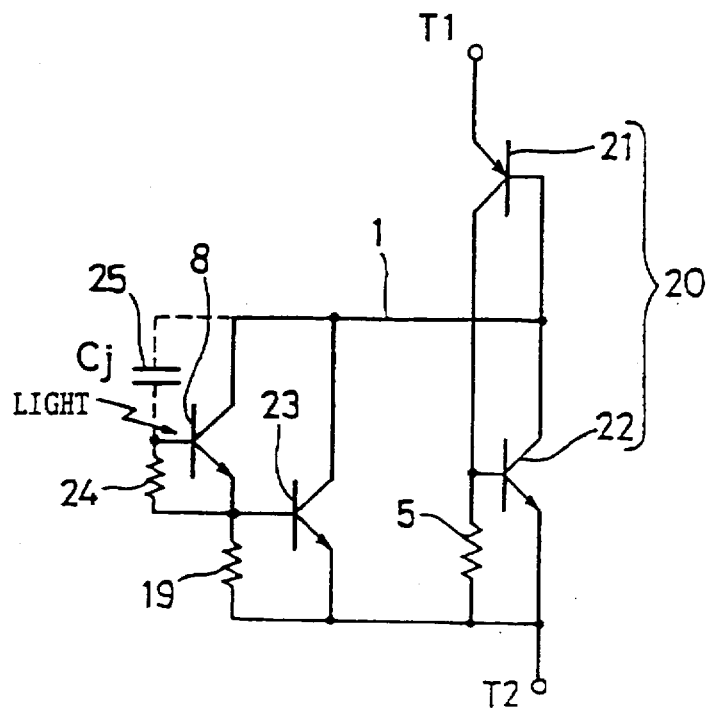
FIG. 17 is an equivalent circuit diagram in the case where a zero-cross circuit is not included in FIG. 12.

FIG. 11 shows a relation between the separation distance x(μm) and the commutation characteristic of the gate region of each channel in the bidirectional three terminal thyristor comprising one chip. Symbol [o] represents characteristic seen when no semiconductor layer is formed on the rear surface of the chip and the substrate remains as it is while symbol [●] represents the characteristic seen when the $N^+$-type layer is formed 4on the rear surface of the chip.

A value of commutation characteristic which is required for operating the bidirectional three terminal thyristor in a stable manner is set to, for example, 100 mA. When the $N^+$-type layer is formed on the rear surface of the chip, the separation distance between the gate regions of respective channels must be set to 800 μm or more. In the structure of the invention, the commutation characteristic can be defined as 100 mA when the separation distance is about 250 m. When the bidirectional three terminal thyristor is actually formed, the separation distance is set to 400 μm, the commutation characteristic is 150 mA.

In the embodiment which has been described so far, an explanation is given with respect to a case in which a bidirectional three terminal thyristor having thyristors 60 connected in reverse parallel to each other is optically controlled. Even when the thyristor is not optically controlled, the breakdown dV/dt can be enhanced. Furthermore, the invention can be applied also to the reverse blocking thyristor instead of the bidirectional three terminal thyristor for alternating current control. Furthermore, although the phototransistor is used as a light receiving element, the photodiode or the like can be used. Furthermore, it is possible to form a light-emitting diode for control on a chip which is separate from the semiconductor chip to enhance the electric insulation and form a photocoupling, thereby constituting a solid state switching device which is also referred to as a solid state relay (SSR).

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor integrated circuit provided with a thyristor which is integrated with a gate drive circuit on one and the same semiconductor chip, comprising:

a dV/dt circuit which includes:

a MOSFET having a drain electrode and a source electrode which are connected between input terminals of the gate, drive circuit;

a capacitor having one end connected to a gate terminal of the thyristor and another end connected to a gate electrode of the MOSFET;

a constant voltage device connected between the gate electrode and source electrode of the MOSFET; and a resistor connected in series to the constant voltage device between the gate electrode and source electrode of the MOSFET.

2. The semiconductor integrated circuit provided with a thyristor of claim 1, wherein the constant voltage device is a zener diode, and the zener voltage and the resistance value of the resistor are adjusted so that the gate electrode voltage of the MOSFET can be held durably to a level more than a threshold or more for a time longer than a predetermined time.

3. The semiconductor integrated circuit provided with a thyristor of claim 1, wherein the capacitor is formed by providing a dielectric film having a higher dielectric constant than that of a semiconductor oxide film on a substrate of the semiconductor chip, and an impurity diffusion layer of a conductive type different from that of the semiconductor chip substrate is arranged on the periphery of the dielectric film.

4. The semiconductor integrated circuit of claim 1, wherein the thyristor is a bidirectional three terminal thyristor in which two thyristors for two channel are connected in parallel so as to be arranged in opposite directions to each other.

5. The semiconductor integrated circuit provided with a thyristor of claim 4, wherein the thyristors for two channels are integrated on one and the same semiconductor chip, and each of the thyristors is provided with a gate drive circuit and al dV/dt clamp circuit.

6. The semiconductor integrated circuit provided with a thyristor of claim 4, wherein the gate drive circuit has a zero-cross function.

7. The semiconductor integrated circuit provided with a thyristor of claim 1, wherein the gate drive circuit includes a light receiving element for optical control.

8. The semiconductor integrated circuit provided with a thyristor of claim 7, wherein the light receiving element is a phototransistor, and the drain electrode and source electrode of the MOSFET are connected between the base electrode and emitter electrode of the phototransistor.

9. The semiconductor integrated circuit provided with a thyristor of claim 7, the semiconductor integrated circuit further comprising light emitting means capable of transmitting an optical signal for driving the thyristor in a state electrically insulated from the semiconductor chip.

10. The semiconductor integrated circuit provided with a thyristor of claim 5, wherein the gate drive circuit has a zero-cross function.

11. The semiconductor integrated circuit provided with a thyristor of claim 8, the semiconductor integrated circuit further comprising light emitting means capable of transmitting an optical signal for driving the thyristor in a state electrically insulated from the semiconductor chip.

* * * * *